United States Patent
Belau et al.

(10) Patent No.: US 6,448,784 B1
(45) Date of Patent: Sep. 10, 2002

(54) CONFIGURATION AND METHOD FOR TESTING A CIRCUIT APPARATUS PROVIDED FOR CONTROLLING AN OCCUPANT PROTECTION DEVICE OF A MOTOR VEHICLE

(75) Inventors: Horst Belau, Langquaid; Christian Zelger, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/494,779

(22) Filed: Jan. 31, 2000

Related U.S. Application Data

(63) Continuation of application No. PCT/DE98/02023, filed on Jul. 17, 1998.

(51) Int. Cl.[7] ........................ G01R 31/12; H01H 31/02; B60L 1/00; B60Q 1/00

(52) U.S. Cl. ...................... 324/548; 324/537; 307/10.1; 340/436

(58) Field of Search ................................ 307/10.1, 9.1; 324/500, 548, 537; 102/206, 218; 340/436

(56) References Cited

U.S. PATENT DOCUMENTS

| | | | | |
|---|---|---|---|---|
| 4,680,512 A | * | 7/1987 | Melocik ...................... 318/139 |
| 4,933,570 A | * | 6/1990 | Swart et al. ................ 307/10.1 |
| 4,977,340 A | * | 12/1990 | Kohl et al. .................. 327/558 |
| 4,999,566 A | * | 3/1991 | Kuehn ......................... 323/222 |
| 5,522,617 A | * | 6/1996 | Swart .......................... 280/735 |
| 5,608,269 A | * | 3/1997 | Fendt et al. .................. 307/9.1 |
| 5,646,454 A | * | 7/1997 | Mattes et al. .............. 307/10.1 |
| 5,668,528 A | * | 9/1997 | Kitao et al. .................. 340/436 |
| 5,672,916 A | * | 9/1997 | Mattes et al. .............. 307/10.1 |
| 5,804,973 A | * | 9/1998 | Shinohara et al. .......... 324/548 |
| 5,898,122 A | * | 4/1999 | Davis et al. ................. 102/206 |
| 6,072,246 A | * | 6/2000 | Schafer ....................... 307/10.1 |
| 6,181,021 B1 | * | 1/2001 | Zabler et al. ............... 307/10.1 |

FOREIGN PATENT DOCUMENTS

| | | |
|---|---|---|
| DE | 3920693 A1 | 1/1991 |
| DE | 4224477 A1 | 2/1993 |
| DE | 4445093 A1 | 12/1995 |
| DE | 19644858 A1 | 5/1997 |
| EP | 0453236 A1 | 10/1991 |
| EP | 0684163 A2 | 11/1995 |
| EP | 0701928 A1 | 3/1996 |

OTHER PUBLICATIONS

Published International Application No. 93/17893 (Swart), dated Sep. 16, 1993.

* cited by examiner

*Primary Examiner*—N. Le
*Assistant Examiner*—Wasseem H. Hamdan
(74) *Attorney, Agent, or Firm*—Laurence A. Greenberg; Werner H. Stemer; Gregory L. Mayback

(57) ABSTRACT

A circuit apparatus for controlling an occupant protection device for a motor vehicle has a parallel circuit, which includes an energy storage capacitor and a series circuit. The series circuit includes a triggering element and a controllable power stage. An energy source supplies a test current to the parallel circuit. When the energy storage capacitor is at least substantially discharged and when the power stage is switched to a conducting state for test purposes, a test voltage from the series circuit is taken up and evaluated. A method of testing an operability of an occupant protection device for a motor vehicle is also provided.

12 Claims, 2 Drawing Sheets

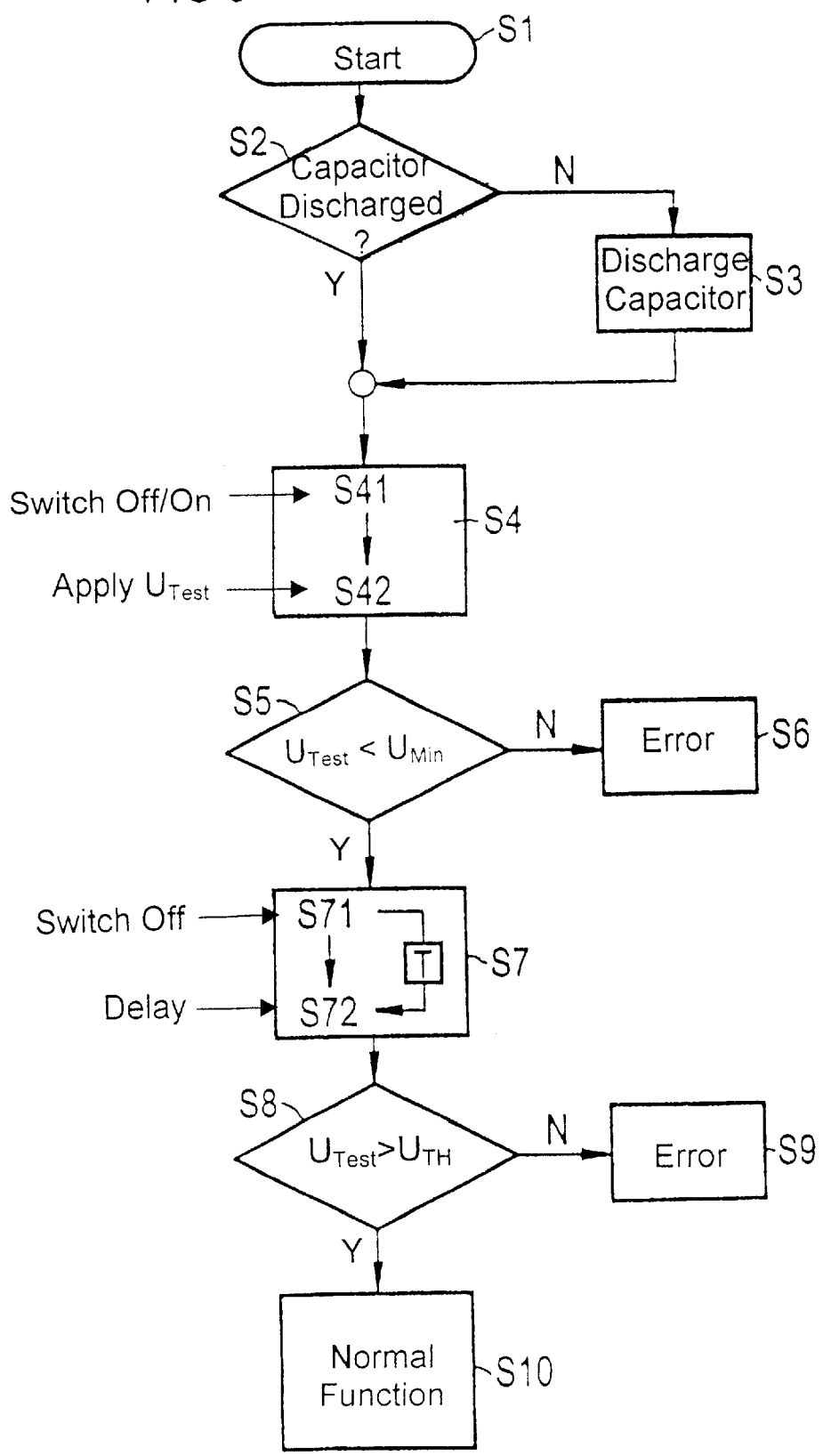

CONFIGURATION AND METHOD FOR TESTING A CIRCUIT APPARATUS PROVIDED FOR CONTROLLING AN OCCUPANT PROTECTION DEVICE OF A MOTOR VEHICLE

CROSS-REFERENCE TO RELATED APPLICATION

This application is a continuation of copending International Application No. PCT/DE98/02023, filed Jul. 17, 1998, which designated the United States.

BACKGROUND OF THE INVENTION

Field of the Invention

The invention relates to a configuration and a method for testing a circuit apparatus provided for controlling an occupant protection device of a motor vehicle.

The European Patent EP 0 684 163 B1 describes a circuit apparatus for controlling an occupant protection device of a motor vehicle. An energy storage capacitor is provided in parallel with a series circuit including a first controllable power stage, a triggering element for the occupant protection device and a further controllable power stage. The occupant protection device, which is an airbag or seatbelt pretensioner, is triggered only if the two controllable power stages are turned on. To check the operability of a power stage, a control circuit causes a respective one of the power stages to be turned on for test purposes, while at the same time the other power stage remains turned off, so that the triggering element is not triggered. A respective current sensor is allocated to each power stage. The current determined during the test routine described above allows conclusions to be drawn about the operability of the power stage which is being checked.

Such a series circuit, which has two controllable power stages and a triggering element, takes up a large area, in particular because of the required number of controllable power stages when such a series circuit is implemented as an integrated circuit. As a consequence, such a series circuit is complex and costly to produce.

The Published International Patent Application WO 93/17893 discloses a circuit apparatus for controlling an occupant protection device of a motor vehicle. The circuit apparatus has an energy storage device which is provided in parallel with a series circuit including a triggering element and a single controllable power stage. The occupant protection device, in the form of an airbag or seatbelt pretensioner, is triggered when the controllable power switch is turned on. In such a circuit apparatus it is not possible to check the operability of the controllable power stage, since any driving for test purposes causes the energy storage capacitor to be discharged via the triggering element. The result would be an undesirable triggering of the occupant protection device.

SUMMARY OF THE INVENTION

It is accordingly an object of the invention to provide a configuration and a method for testing a circuit apparatus provided for an occupant protection which overcome the above-mentioned disadvantages of the heretofore-known configurations and methods of this general type and which, despite requiring only a small number of components, permit a reliable checking of the operation and a reliable function testing.

With the foregoing and other objects in view there is provided, in accordance with the invention, a configuration for testing an operability of an occupant protection device for a motor vehicle. The configuration includes a circuit apparatus including a series circuit and an energy storage capacitor, the series circuit including a triggering element and a controllable power stage, the energy storage capacitor being connected in parallel to the series circuit for forming a parallel circuit; an energy source for supplying a test current to the parallel circuit; and an evaluator for picking up and evaluating a test voltage dropping in the series circuit, when the energy storage capacitor is at least substantially discharged and the controllable power stage is switched to a conducting state.

In accordance with another feature of the invention, a junction point is provided between the triggering element and the controllable power stage. The energy source has a terminal and the evaluator taps the test voltage between the junction point and the terminal of the energy source.

In accordance with yet another feature of the invention, the evaluator uses a voltage drop across the energy storage capacitor for checking whether the energy storage capacitor is at least substantially discharged. The evaluator switches the controllable power stage into the conducting state for test purposes only if the energy storage capacitor is at least substantially discharged.

In accordance with a further feature of the invention, the triggering element can be triggered by a triggering current that is smaller than the test current.

In accordance with yet a further feature of the invention, the evaluator generates an error signal based on an evaluation of the test voltage.

In accordance with an added feature of the invention, the evaluator, after switching the controllable power stage to the conducting state, switches the controllable power stage to a non-conducting state for test purposes and subsequently picks up and evaluates the test voltage.

In accordance with another feature of the invention, the evaluator picks up and evaluates the test voltage after a given time period, the given time period starting when the evaluator switches the controllable power stage to the non-conducting state.

In accordance with a further feature of the invention, the evaluator generates an error signal based on an evaluation of the test voltage after switching the controllable power stage to the non-conducting state.

In accordance with another feature of the invention, at least one decoupling resistor is connected in series with the parallel circuit.

With the objects of the invention in view there is also provided, a method of testing an operability of an occupant protection device for a motor vehicle or, more specifically, a method of testing a circuit apparatus that is used to control the occupant protection device. The method includes the steps of providing the circuit apparatus, which includes a series circuit and an energy storage capacitor, the series circuit includes a triggering element and a controllable power stage, the energy storage capacitor is connected in parallel to the series circuit for forming a parallel circuit; supplying a test current to the parallel circuit with an energy source; switching the controllable power stage to a conducting state, when the energy storage capacitor is at least substantially discharged; subsequently picking up a test voltage from the series circuit; and evaluating the test voltage.

In accordance with another mode of the invention, the controllable power stage is switched to a non-conducting state after the step of switching the controllable power stage to the conducting state; and subsequently the test voltage is picked up from the series circuit and the test voltage is evaluated.

Other features which are considered as characteristic for the invention are set forth in the appended claims.

Although the invention is illustrated and described herein as embodied in a configuration and a method for testing a circuit apparatus provided for controlling an occupant protection device for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a flowchart for the method according to the invention for checking the operability of a power stage in a configuration as shown in FIG. 1 or FIG. 2.

DESCRIPTION OF THE PREFERRED EMBODIMENTS

Figure 1:
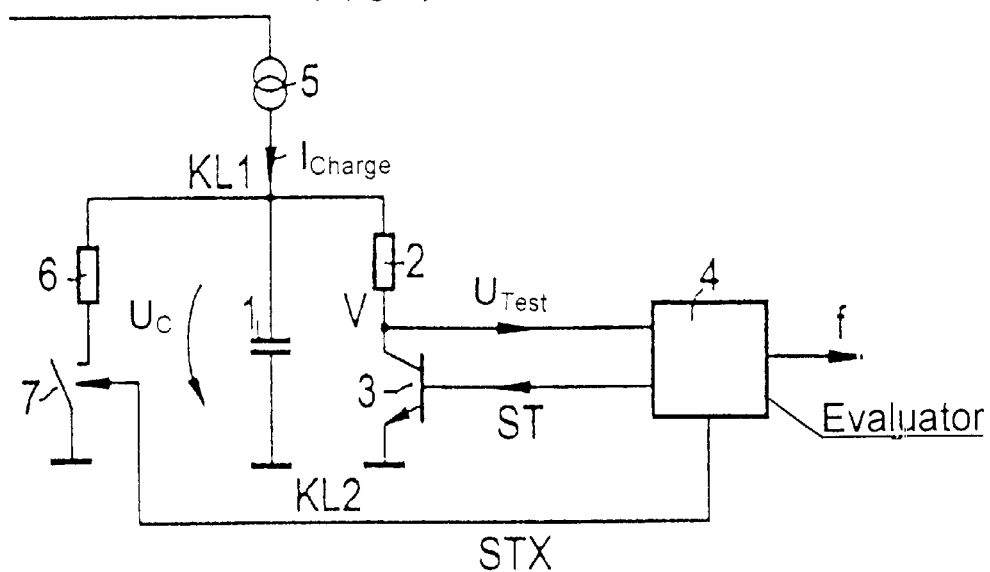
FIG. 1 is a schematic circuit diagram of a first configuration according to the invention.

Referring now to the figures of the drawings in detail and first, particularly, to FIG. 1 thereof, there is shown a circuit diagram of the configuration according to the invention. An energy source 5 in the form of a current source delivers a test current $I_{CHARGE}$ for a parallel circuit, including, on the one hand, an energy storage capacitor 1 and a series circuit including a triggering element or firing element 2 and a controllable power stage 3. The voltage drop $U_C$ across the energy storage capacitor is indicated with an arrow. Terminals KL1 and KL2 identify those circuit points which are connected to the energy source 5. An evaluator or control circuit 4 uses a control signal ST to control the power stage 3 and taps a test voltage $U_{TEST}$, in this case with respect to the ground potential (terminal KL2), at the junction point V between the triggering or firing element 2 and the power stage 3. In addition, the evaluator 4 can supply an error signal f at its output.

The parallel circuit described above contains a further series circuit, which is provided in parallel with the energy storage capacitor 1 and the series circuit 2, 3 described above and includes a resistor 6 and a controllable switch 7 which can be actuated through the use of a further control signal STX from the evaluator 4.

The core concept of the invention is that, when the energy storage capacitor 1 is discharged, it is possible to check the ability of the power stage 3 to turn on or close a circuit. In other words, it is in particular possible to check the switching abilities of the power stage. In this case, the test current $I_{CHARGE}$ delivered by the energy source 5 is proportioned such that the triggering element 2 does not trigger immediately upon having this test current $I_{CHARGE}$ applied to it. Hence, the test current $I_{CHARGE}$ also does not have such a high level that the energy storage capacitor 1 could be charged to its triggering or firing voltage $U_C$ within a very short time. If a control signal ST from the evaluator 4 now causes the power stage 3 to change from the non-conducting state or off state to the conducting state or on state with the energy storage capacitor 1 virtually discharged at the same time, then the test current $I_{CHARGE}$ delivered by the energy source 5 subsequently flows via the triggering element or firing element 2 and the power stage 3. If the test voltage $U_{TEST}$ remains approximately constant, in which case the test voltage $U_{TEST}$ is now approximately equal to ground potential, if it is understood as being the potential difference between the junction point V and ground potential KL2, and hence as being the collector-emitter voltage of the power transistor 3, then this is an indication that the power stage 3 can be switched over from its non-conducting state (off state) to its conducting state (on state) and is thus operational. If, however, the test voltage $U_{TEST}$ rises to values significantly higher than the reference-ground or ground potential KL2, then the controllable power stage 3 cannot be changed from its off state to its on stage and is therefore faulty. The rise in the test voltage $U_{TEST}$ can then be attributed to the energy storage capacitor 1 being charged by the test current $I_{CHARGE}$. Particularly if, then, the test voltage $U_{TEST}$ exceeds a defined voltage value or a defined rise, the evaluator 4 supplies an error signal f as an indication that the power stage 3 is not operational.

If it is has been determined that the controllable power stage 3 can be closed/opened, then a firing tablet resistance (priming cap resistance) and/or the test current $I_{CHARGE}$ delivered by the energy source 5 can be checked by measuring a voltage drop across the triggering element 2. This allows conclusions to be drawn about the operability of the energy source 5 and of the triggering element 2.

After this check of the ability of the controllable power stage 3 to be turned on or close a circuit, a check is carried out to determine whether the power stage 3 can be changed from its non-conducting state or off state to its conducting state or on state. A corresponding control signal ST is in turn supplied by the evaluator 4. If the power stage 3 can be turned off to open the circuit, and is therefore operational, then the test current $I_{CHARGE}$ delivered by the energy source 5 acts completely as a charging current for the energy storage capacitor 1 and charges the latter to a triggering voltage $U_Z$ which is later used f or an i gnition when a collision is detected. This also causes a considerable increase, in particular, in the potential at the junction point V. The evaluator 4 checks the test voltage $U_{TEST}$ either during charging of the energy storage capacitor 1 or after a defined time period, after which the energy storage capacitor 1 has just been charged to its triggering voltage $U_Z$. If the power stage 3 cannot be turned off to open the circuit, then the test current $I_{CHARGE}$ continues to flow via the triggering element 2 and the power stage 3. The test voltage $U_{TEST}$ then corresponds approximately to the ground potential at the terminal KL2 and does not change over time. If, however, the power stage 3 can be turned off to open the circuit, then the test voltage $U_{TEST}$ rises to a voltage value which is significantly higher than the ground potential at the terminal KL2. Hence, if the evaluator 4 detects that the test voltage $U_{TEST}$ exceeds a minimum voltage rise when the control signal ST has been output to turn off the power stage 3 for opening the circuit, then the power stage 3 is deemed as being able to be turned off. Alternatively, after a minimum time after the control signal ST has been output to turn off (open) the controllable switch 3, the test voltage $U_{TEST}$ can also be checked to determine whether it exceeds a minimum voltage value. If this is the case, then the power stage 3 is deemed to be able to be turned off (opened), and therefore as operational, in this case too. However, if the test signal $U_{TEST}$ does not reach the minimum voltage rise or the minimum voltage value, then the power stage 3 is not operational, to the extent that it cannot be changed from the on state (closed state) to the off state (opened state). In this case, the evaluator 4 supplies an error signal f. At the same time as the check is carried out to determine whether the power stage 3 can be turned off, a check is also carried out to determine whether the energy storage capacitor 1 and the current source 5 are operational.

The essential advantage of the configuration according to the invention and of the method according to the invention is that, despite using only a single controllable power stage 3 in a triggering circuit for an occupant protection device, such as an airbag, seatbelt pretensioner, or the like, the same power stage 3 can be tested to determine both whether it can be turned off (opened) and turned on (closed), without triggering the triggering element 2 provided in series with the power stage 3. The number of components used is minimized. Each individually controllable triggering element thus requires only a single controllable power switch in each case.

The energy source 5 is, in particular, a current source supplying an impressed test current $I_{CHARGE}$. Alternatively, a voltage source can be used, but one which must have a relatively high internal resistance so that a virtually load-independent, impressed, and hence particularly limited, test current $I_{CHARGE}$ can likewise be supplied. If, for example, the test current $I_{CHARGE}$ charges the energy storage capacitor 1 with a time constant that is too high when the power stage 3 is turned off (opened), the test current can also assume a higher value for charging the energy storage capacitor 1—that is to say after the ability of the power stage 3 to be turned on has been tested. The triggering element 2 is associated with an occupant protection device such that, in response to being triggered or fired, gas is released, for example, which fills an airbag or at least part of an airbag. The controllable power stage is preferably a controllable power transistor configured for a triggering current which is provided for triggering the triggering element 2 and which comes from the energy storage capacitor 1. The evaluator 4 carries out not only evaluation routines but also, in particular, control routines and is preferably a microprocessor, but can also be configured as an analog circuit or some other measuring and/or control and/or evaluation device. In terms of their configuration relative to the energy source, the controllable power stage 3 and the triggering element 2 can also be provided so that they are interchanged with one another, which means that, as shown in FIG. 1, for example, the triggering element 2 is connected to ground potential KL2. Similarly, the test voltage $U_{TEST}$ can be provided not only with respect to ground potential which is the second terminal KL2 of the energy source 5 but also, of course, with respect to the first terminal KL1. The evaluation of the test voltage $U_{TEST}$ in terms of the mathematical sign and the minimum thresholds must then of course be adapted accordingly.

Before the check to determine whether the power stage 3 can be turned on to close a circuit, a check is preferably carried out to determine whether the energy storage capacitor 1 is discharged at least to the extent that its residual charge can no longer cause the triggering element 2 to be triggered when the power stage 3 is turned on. For this, the capacitor voltage $U_C$ is preferably monitored by the evaluator 4. If the capacitor voltage $U_C$ is lower than a minimum threshold, then the energy storage capacitor 1 is deemed to be almost completely discharged. After this check, the method described above is started. If the energy storage capacitor 1 has not been discharged to the required minimum extent, then it can be discharged, for example before the method described above is started by an appropriate control signal STX from the evaluator 4, which acts as a control circuit in this case. The control signal STX turns on the controllable switch 7, via the resistor 6, before, in the following step, the control signal ST causes the power stage 3 to change from its off to its on state and the test voltage $U_{TEST}$ is then measured and processed. After the controlled discharge of the energy storage capacitor 1 and before the operational check to determine whether the power stage 3 can be turned on (closed), the charge state of the energy storage capacitor 1 should preferably be checked again.

By evaluating the triggering voltage $U_C$ of the energy storage capacitor 1 or the test voltage $U_{TEST}$ during the charging operation when the power stage 3 is turned off, e.g. by evaluating the voltage rise or the voltage value at a defined measuring time, it is also possible to draw conclusions about the capacitance of the energy storage capacitor 1. The capacitance C of the capacitor 1 is then determined with the equation $dU/dt = I_{CHARGE}/C$, where $dU/dt$ is a voltage change while the capacitor 1 is being charged.

At the end of the test method according to the invention, the evaluator 4, by turning on the power stage 3 when the energy storage capacitor has been charged with the triggering voltage $U_Z$, causes the triggering element 2 to trigger. For this, the evaluator 4 processes collision signals from the vehicle, recorded in particular by suitable sensors, and supplies an appropriate control signal ST to trigger the triggering element 2 only if a collision is regarded as being strong enough to trigger occupant protection devices.

Figure 2:
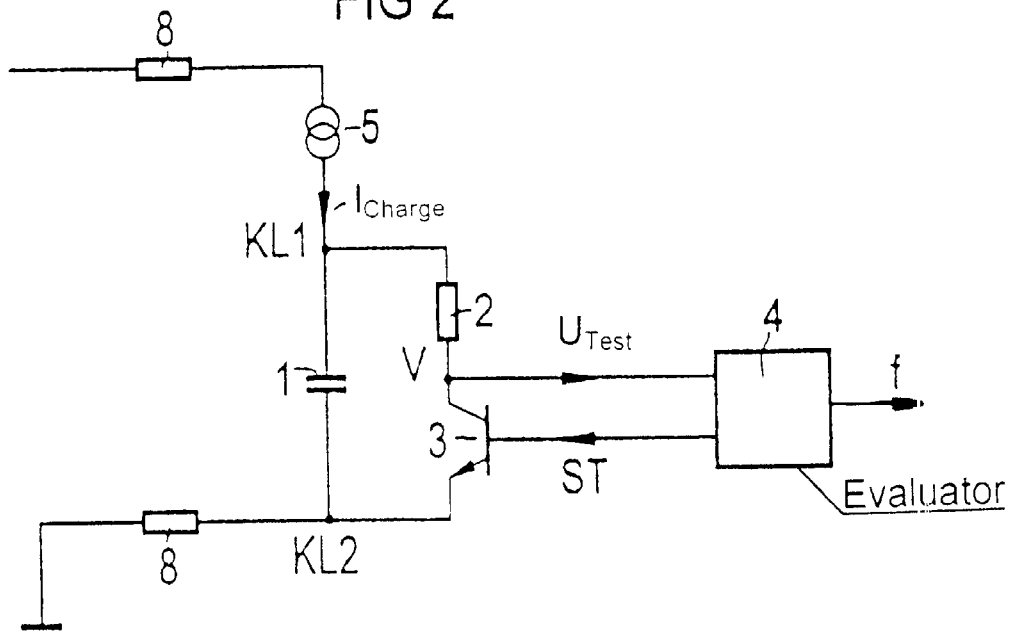
FIG. 2 is a schematic circuit diagram of a further configuration according to the invention.

The essential difference between FIG. 2 and FIG. 1 is that high-resistance decoupling resistors 8 are connected to terminal KL2 and terminal KL1 or to the energy source 5. The effect of these decoupling resistors 8 is that, when there is a short circuit between one of the connection terminals of the triggering element 2 and one of the supply potentials, the stored energy in the energy storage capacitor 1 is under no circumstances output via the triggering element 2 to the extent that the triggering current required for triggering would be reached.

The circuit apparatus can be provided in different locations in the vehicle. Hence, for example, the entire circuit apparatus as shown in FIG. 2, with the exception of the triggering element 2, is accommodated in a common control unit which is preferably provided centrally in the vehicle. The triggering element 2 is connected to the control unit via triggering lines. Alternatively, the entire circuit apparatus as shown in FIG. 2, can be provided close to the occupant protection device, with the decoupling resistors 8 having a line to the energy supply attached, which, by way of example, is directly connected to the vehicle supply network or to a central control unit for occupant protection. In particular, in such a decentralized configuration of the circuit apparatus, messages can be transmitted in the form of data via the line which is connected to the decoupling resistors 8. Such messages contain, for example, a triggering command for triggering the triggering element 2, diagnostic commands or diagnostic results or initialization messages. The data stream is output and supplied to the evaluator 4, which decrypts the coded messages and turns the power stage 3 off or on as appropriate. The connected line is, in particular, configured as a bus to which a plurality of circuit apparatuses as described above are connected via decoupling resistors 8. The effect of the decoupling resistors 8 is then that, in the event of a short circuit in a circuit apparatus—e.g.

as a result of a triggering of the triggering element—the entire bus is not short-circuited and the further circuit apparatuses can no longer be triggered.

FIG. 3 shows an exemplary embodiment of the method according to the invention. In step S1, the test routine according to the invention for checking the operability of the power switch 3 in a circuit configuration as shown in FIG. 1 or FIG. 2 is started: then, in step S2, a check is carried out to determine whether the energy storage capacitor 1 is at least largely discharged. If the energy storage capacitor 1 is discharged to a large degree, step S4 is carried out, and if the energy storage capacitor 1 is not discharged, it is virtually completely discharged in step S3. In step S4, the power stage 3 is first changed from the off to the on state—step S41—before the test voltage $U_{TEST}$ is taken up—step S42. In step S5, a check is carried out to determine whether the test voltage $U_{TEST}$ exceeds a minimum voltage value $U_{MIN}$: if this is ot the case, an error signal f is produced in step S6, because the power stage obviously cannot be turned on. If however, the test voltage $U_{TEST}$ is below the minimum voltage value $U_{MIN}$, the power stage 3 is subsequently first driven in step S7 so that it is to be turned off—step S71. There is then a delay for a defined time T, as indicated by step S72, before the test voltage $U_{TEST}$ is compared with a further threshold value $U_{TH}$, which may be equal to the minimum threshold value from step S5. If the test voltage $U_{TEST}$ exceeds this threshold value, then normal functional operation of the circuit apparatus to control an occupant protection device is continued in step S10. Otherwise, an error signal f—optical or acoustic—is in turn produced in step S9, because the power stage 3 obviously cannot be changed from the on state to the off state.

The checking method shown in FIG. 3 can be carried out during normal operation of the circuit apparatus, that is to say when the vehicle ignition is turned on, in which case step S3 for discharging the energy storage capacitor is necessary under all circumstances. If the proposed method is carried out when the control apparatus is started up, that is to say when the vehicle is started through the use of the vehicle ignition, then the energy storage capacitor is usually in the discharged state.

We claim:

1. A configuration for testing an operability of an occupant protection device for a motor vehicle, comprising:

a circuit apparatus including a series circuit and an energy storage capacitor, said series circuit including a triggering element and a controllable power stage, said energy storage capacitor being connected in parallel to said series circuit for forming a parallel circuit;

an energy source for supplying a test current to said parallel circuit; and an evaluator for picking up a test voltage dropping in said series circuit, when said energy storage capacitor is at least substantially discharged and said controllable power stage is switched to a conducting state, said evaluator evaluating the test voltage.

2. The configuration according to claim 1, including a junction point between said triggering element and said controllable power stage, said energy source having a terminal, said evaluator tapping the test voltage between said junction point and said terminal of said energy source.

3. The configuration according to claim 1, wherein said evaluator uses a voltage drop across said energy storage capacitor for checking whether said energy storage capacitor is at least substantially discharged, said evaluator switching said controllable power stage into the conducting state for test purposes only if said energy storage capacitor is at least substantially discharged.

4. The configuration according to claim 1, wherein said triggering element is triggerable by a triggering current being smaller than the test current.

5. The configuration according to claim 1, wherein said evaluator generates an error signal based on an evaluation of the test voltage.

6. The configuration according to claim 1, wherein said evaluator, after switching said controllable power stage to the conducting state, switches said controllable power stage to a non-conducting state for test purposes and subsequently picks up and evaluates the test voltage.

7. The configuration according to claim 6, wherein said evaluator picks up and evaluates the test voltage after a given time period, the given time period starting when said evaluator switches said controllable power stage to the non-conducting state.

8. The configuration according to claim 6, wherein said evaluator generates an error signal based on an evaluation of the test voltage after switching said controllable power stage to the non-conducting state.

9. The configuration according to claim 7, wherein said evaluator generates an error signal based on an evaluation of the test voltage after switching said controllable power stage to the non-conducting state.

10. The configuration according to claim 1, including at least one decoupling resistor connected in series with said parallel circuit.

11. A method of testing an operability of an occupant protection device for a motor vehicle, the method which comprises:

providing a circuit apparatus including a series circuit and an energy storage capacitor, the series circuit including a triggering element and a controllable power stage, the energy storage capacitor being connected in parallel to the series circuit for forming a parallel circuit;

supplying a test current to the parallel circuit with an energy source;

switching the controllable power stage to a conducting state, when the energy storage capacitor is at least substantially discharged;

subsequently picking up a test voltage from the series circuit; and evaluating the test voltage.

12. The method according to claim 11, which comprises:

switching the controllable power stage to a non-conducting state after the step of switching the controllable power stage to the conducting state; and subsequently picking up the test voltage from the series circuit; and evaluating the test voltage.

* * * * *

UNITED STATES PATENT AND TRADEMARK OFFICE
CERTIFICATE OF CORRECTION

PATENT NO. : 6,448,784 B1
DATED : September 10, 2002
INVENTOR(S) : Horst Belau et al.

It is certified that error appears in the above-identified patent and that said Letters Patent is hereby corrected as shown below:

<u>Title page,</u>
Item [30], should read as follows:

-- Foreign Application Priority Data
Jul. 29, 1997   (DE) ..................... 197 32 677.3 --

Signed and Sealed this

Twenty-ninth Day of April, 2003

JAMES E. ROGAN
*Director of the United States Patent and Trademark Office*